(12) United States Patent
Park et al.

(10) Patent No.: US 11,848,285 B2
(45) Date of Patent: Dec. 19, 2023

(54) SEMICONDUCTOR CHIP INCLUDING BURIED DIELECTRIC PATTERN AT EDGE REGION, SEMICONDUCTOR PACKAGE INCLUDING THE SAME, AND METHOD OF FABRICATING THE SAME

(71) Applicant: SAMSUNG ELECTRONICS CO., LTD., Suwon-si (KR)

(72) Inventors: Kwangwuk Park, Seoul (KR); Youngmin Lee, Hwaseong-si (KR); Inyoung Lee, Yongin-si (KR); Sungdong Cho, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 114 days.

(21) Appl. No.: 17/671,818

(22) Filed: Feb. 15, 2022

(65) Prior Publication Data
US 2023/0044131 A1 Feb. 9, 2023

(30) Foreign Application Priority Data
Aug. 4, 2021 (KR) .................. 10-2021-0102574

(51) Int. Cl.
*H01L 23/58* (2006.01)
*H01L 25/065* (2023.01)
*H01L 23/522* (2006.01)

(52) U.S. Cl.
CPC ........ *H01L 23/585* (2013.01); *H01L 23/5226* (2013.01); *H01L 25/0657* (2013.01)

(58) Field of Classification Search
CPC .................. H01L 23/585; H01L 25/0657; H01L 23/5226
See application file for complete search history.

(56) References Cited

U.S. PATENT DOCUMENTS

| 7,892,949 B2 | 2/2011 | Abe et al. |
| 9,406,625 B2 | 8/2016 | Wang et al. |
| 10,861,799 B1 | 12/2020 | Wu et al. |
| 10,879,152 B2 * | 12/2020 | Xu ..................... H01L 25/0652 |
| 10,930,602 B2 | 2/2021 | Cho et al. |

(Continued)

FOREIGN PATENT DOCUMENTS

| JP | 2006-222258 A | 8/2006 |
| JP | 5553642 B2 | 7/2014 |

(Continued)

*Primary Examiner* — Dale E Page
*Assistant Examiner* — Wilner Jean Baptiste
(74) *Attorney, Agent, or Firm* — Muir Patent Law, PLLC

(57) ABSTRACT

A semiconductor chip, a semiconductor package including the same, and a method of fabricating the same, the semiconductor chip including a substrate that includes a device region and an edge region; a device layer and a wiring layer that are sequentially stacked on the substrate; a subsidiary pattern on the wiring layer on the edge region; a first capping layer that covers a sidewall of the subsidiary pattern, a top surface of the wiring layer, and a sidewall of the wiring layer, the first capping layer including an upper outer sidewall and a lower outer sidewall, the lower outer sidewall being offset from the upper outer sidewall; and a buried dielectric pattern in contact with the lower outer sidewall of the first capping layer and spaced apart from the upper outer sidewall of the first capping layer.

20 Claims, 16 Drawing Sheets

(56) References Cited

U.S. PATENT DOCUMENTS

| | | | |
|---|---|---|---|
| 2003/0134499 A1* | 7/2003 | Chen | ................ H01L 21/76801 |
| | | | 257/E23.161 |
| 2008/0160724 A1 | 7/2008 | Song et al. | |
| 2021/0057328 A1* | 2/2021 | Lee | .................... H01L 23/5222 |
| 2021/0091045 A1 | 3/2021 | Heo et al. | |

FOREIGN PATENT DOCUMENTS

| KR | 10-0825798 B1 | 4/2008 |
|---|---|---|
| KR | 10-1962754 B1 | 3/2019 |

\* cited by examiner

SEMICONDUCTOR CHIP INCLUDING BURIED DIELECTRIC PATTERN AT EDGE REGION, SEMICONDUCTOR PACKAGE INCLUDING THE SAME, AND METHOD OF FABRICATING THE SAME

CROSS-REFERENCE TO RELATED APPLICATION

This U.S. nonprovisional application claims priority under 35 U.S.C. § 119 to Korean Patent Application No. 10-2021-0102574, filed on Aug. 4, 2021, in the Korean Intellectual Property Office, the contents of which is hereby incorporated by reference in its entirety.

BACKGROUND

1. Field

Embodiments relate to a semiconductor chip including a buried dielectric pattern at an edge region thereof, a semiconductor package including the semiconductor chip, and a method of fabricating the semiconductor chip.

2. Description of the Related Art

A wafer including semiconductor devices may include chip regions on which a plurality of cells are formed and a scribe lane that divides chips from each other. A plurality of semiconductor devices, e.g., transistors, resistors, and capacitors, may be formed on the chip regions and may not be formed on the scribe lane. The wafer may be sawed along the scribe lane to complete or separate each of the semiconductor devices (or semiconductor chips).

SUMMARY

The embodiments may be realized by providing a semiconductor chip including a substrate that includes a device region and an edge region; a device layer and a wiring layer that are sequentially stacked on the substrate; a subsidiary pattern on the wiring layer on the edge region; a first capping layer that covers a sidewall of the subsidiary pattern, a top surface of the wiring layer, and a sidewall of the wiring layer, the first capping layer including an upper outer sidewall and a lower outer sidewall, the lower outer sidewall being offset from the upper outer sidewall; and a buried dielectric pattern in contact with the lower outer sidewall of the first capping layer and spaced apart from the upper outer sidewall of the first capping layer.

The embodiments may be realized by providing a semiconductor chip including a substrate that includes a device region and an edge region; a device layer and a wiring layer that are sequentially stacked on the substrate; a separation dielectric pattern that penetrates the wiring layer while being adjacent to a boundary between the device region and the edge region; a subsidiary pattern on the wiring layer on the edge region; a pad pattern on the wiring layer on the device region; a passivation layer that covers the pad pattern and the subsidiary pattern; a first capping layer that covers a sidewall of the subsidiary pattern and a sidewall of the wiring layer; and a buried dielectric pattern in contact with a lower outer sidewall of the first capping layer, wherein a top surface of the buried dielectric pattern forms a stepped region extending from a top surface of the passivation layer, the wiring layer includes a lower dielectric stack and an upper dielectric stack that are sequentially stacked, a dielectric material included in the lower dielectric stack has a dielectric constant less than a dielectric constant of a dielectric material included in the upper dielectric stack, the subsidiary pattern includes a test pattern or an alignment key, and a density of the first capping layer is greater than a density of the buried dielectric pattern.

The embodiments may be realized by providing a semiconductor package including a first semiconductor chip; second semiconductor chips stacked on the first semiconductor chip; and a mold layer that covers lateral surfaces of the second semiconductor chips and a top surface of the first semiconductor chip, wherein each of the second semiconductor chips includes a second substrate and a circuit structure below the second substrate, the second substrate includes a device region and an edge region that surrounds the device region, the circuit structure includes a device layer and a wiring layer that sequentially stacked below the second substrate; a subsidiary pattern below the wiring layer on the edge region; a pad pattern below the wiring layer on the device region; a passivation layer that covers a bottom surface of the pad pattern and a bottom surface of the subsidiary pattern; a first capping layer that covers a sidewall of the subsidiary pattern and a sidewall of the wiring layer; and a buried dielectric pattern in contact with an upper outer sidewall of the first capping layer, a bottom surface of the buried dielectric pattern forms a stepped region extending from a bottom surface of the passivation layer, and the mold layer fills the stepped region.

The embodiments may be realized by providing a method of fabricating a semiconductor chip, the method including forming a wiring layer on a substrate that includes a plurality of device regions and a scribe lane region between the device regions; etching the wiring layer to form a plurality of primary wiring structures that overlap the device regions and a plurality of edge wiring structures that overlap the scribe lane region; forming a separation dielectric pattern and a buried dielectric pattern such that the separation dielectric pattern is between a pair of neighboring primary and edge wiring structures among the primary wiring structures and the edge wiring structures, and the buried dielectric pattern is between neighboring edge wiring structures; forming a passivation layer that covers the primary wiring structures, the edge wiring structures, the separation dielectric pattern, and the buried dielectric pattern; removing the passivation layer from a center of the scribe lane region to form a trench that exposes the buried dielectric pattern; and dicing the buried dielectric pattern and the substrate thereunder to form a plurality of chips that are separated from each other.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
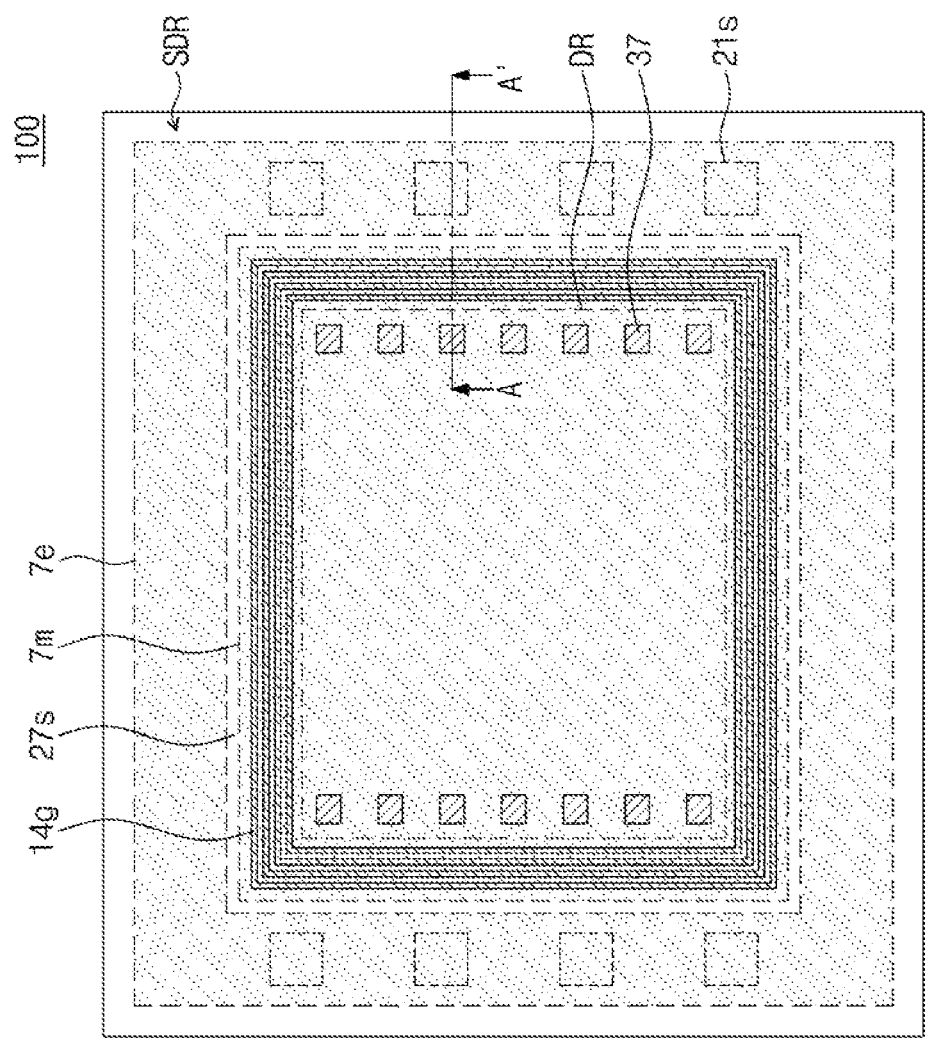
FIG. 1 illustrates a plan view of a semiconductor device according to some embodiments.
Figure 2:
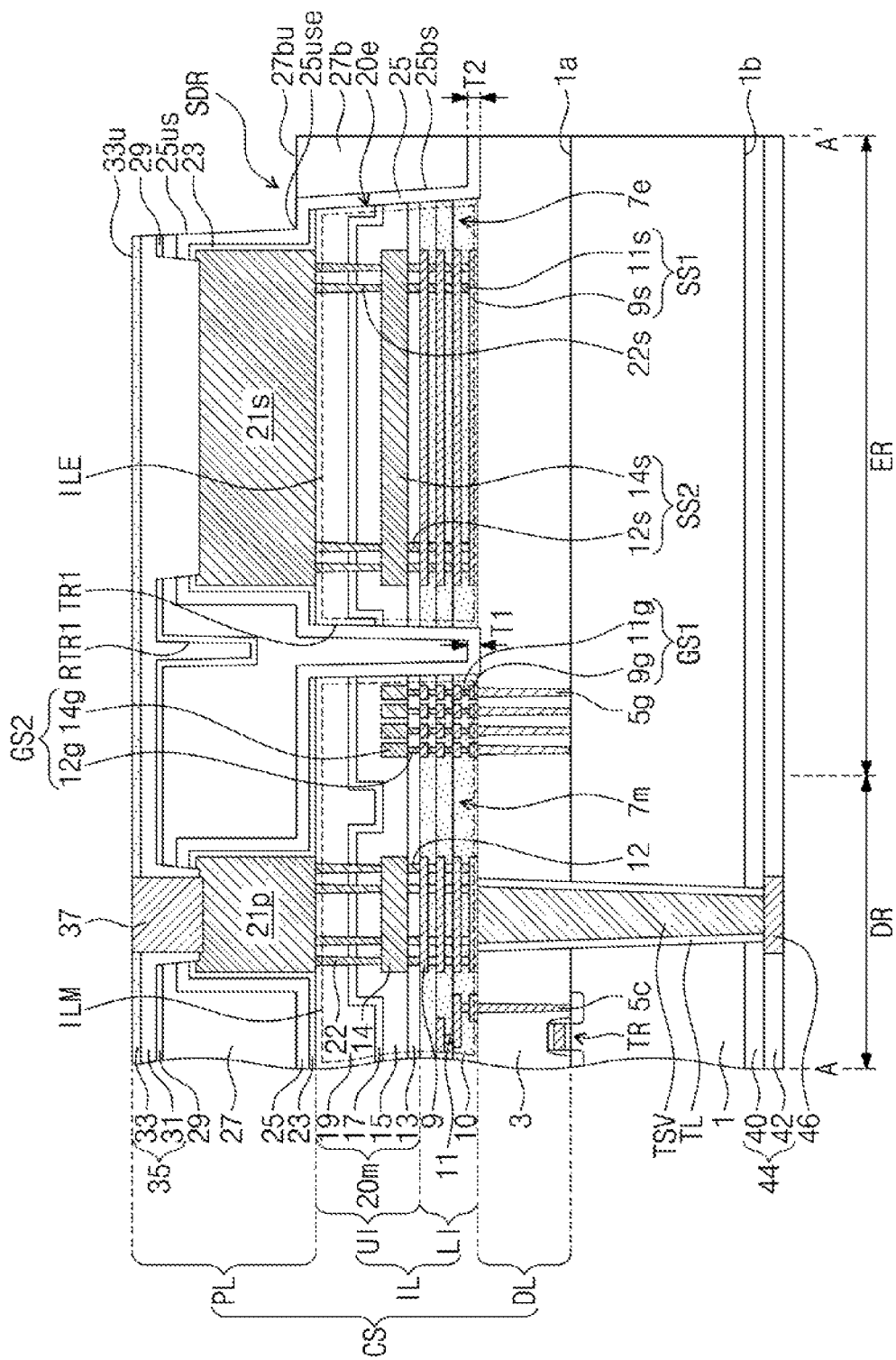
FIG. 2 illustrates a cross-sectional view taken along line A-A' of FIG. 1.

FIG. 1 illustrates a plan view of a semiconductor device according to some embodiments. FIG. 2 illustrates a cross-sectional view taken along line A-A' of FIG. 1.

Referring to FIGS. 1 and 2, a semiconductor chip 100 according to the present embodiment may include a substrate 1 and a circuit structure CS. The substrate 1 may include, e.g., a semiconductor material. The substrate 1 may be a monocrystalline silicon substrate. The substrate 1 may include a device region DR and an edge region ER that surrounds the device region DR. The substrate 1 may have a first surface 1a and a second surface 1a that are opposite to each other. The circuit structure CS may be on the first surface 1a of the substrate 1. The circuit structure CS may include a device layer DL, a wiring layer IL, and a pad layer PL that are sequentially stacked.

Transistors TR may be on the first surface 1a of the substrate 1 on the device region DR. In an implementation, the first surface 1a on the device region DR may include a shallow isolation pattern, memory cells, capacitors, or the like. The first surface 1a of the substrate 1 may be covered with a device interlayer dielectric layer 3. The device interlayer dielectric layer 3 may have a single-layered or multi-layered structure including, e.g., silicon oxide, silicon nitride, or silicon oxynitride. On the device region DR, the device interlayer dielectric layer 3 may include contact plugs 5c therein connected to the transistors TR. On the edge region ER, the device interlayer dielectric layer 3 may include first guard ring patterns 5g. As used herein, the term "or" is not an exclusive term, e.g., "A or B" would include A, B, or A and B.

The contact plugs 5c and the first guard ring patterns 5g may include the same material, e.g., tungsten. In an implementation, the contact plugs 5c and the first guard ring patterns 5g may be covered with a barrier metal on lateral and bottom surfaces thereof. The barrier metal may include, e.g., titanium, titanium nitride, tantalum, tantalum nitride, or tungsten nitride. The contact plugs 5c and the first guard ring patterns 5g may penetrate the device interlayer dielectric layer 3. The device layer DL may be constituted by the transistors TR, the device interlayer dielectric layer 3, the contact plugs 5c, and the first guard ring patterns 5g.

Likewise, fifth guard ring patterns 14g which will be discussed below with reference to FIG. 1, when viewed in a plan view, each of the first guard ring patterns 5g may have a ring shape that surrounds the device region DR. The first guard ring patterns 5g may protect the device layer DL on the device region DR against moisture or physical cracks.

A lower wiring layer LI may be on the device interlayer dielectric layer 3. The lower wiring layer LI may include a primary lower dielectric stack 7m and an edge lower dielectric stack 7e that are spaced apart from each other. The primary lower dielectric stack 7m and the edge lower dielectric stack 7e may each include a plurality of lower intermetallic dielectric layers 10. The lower intermetallic dielectric layers 10 may include a low-k dielectric material that has dielectric constant less than that of silicon oxide. In an implementation, the lower intermetallic dielectric layers 10 may be porous dielectric layers. Each of the lower intermetallic dielectric layers 10 may have mechanical strength less than that of the device interlayer dielectric layer 3. In an implementation, an etch stop layer may be interposed between the lower intermetallic dielectric layers 10. The etch stop layer may include, e.g., silicon nitride, silicon oxynitride, or silicon carbonitride.

The primary lower dielectric stack 7m may cover the device region DR and a portion of the edge region ER adjacent to the device region DR. When viewed in a plan view as shown in FIG. 1, the edge lower dielectric stack 7e may be on the edge region ER and may surround the primary lower dielectric stack 7m.

The lower wiring layer LI may include a plurality of lower wiring patterns 9 in the primary lower dielectric stack 7m on the device region DR, and may also include lower via patterns 11 that connect the lower wiring patterns 9 to each other. The lower wiring layer LI may further include a lower guard ring structure GS1 in the primary lower dielectric stack 7m on the edge region ER. The lower guard ring structure GS1 may include second guard ring patterns 9g and third guard ring patterns 11g that connect the second guard ring patterns 9g to each other. The second guard ring patterns 9g may be at the same height (level) as that of the lower wiring patterns 9 and may include the same material as that of the lower wiring patterns 9. The third guard ring patterns 11g may be at the same height (level) as that of the lower via patterns 11 and may include the same material as that of the lower via patterns 11. When viewed in a plan view, the second and third guard ring patterns 9g and 11g may each have an annular or closed loop shape that surrounds the device region DR. The lower guard ring structure GS1 may help protect the lower wiring layer LI on the device region DR against moisture or physical cracks.

The lower wiring layer LI may include a first subsidiary pattern structure SS1 in or adjacent to the edge lower dielectric stack 7e. The first subsidiary pattern structure SS1 may include first subsidiary patterns 9s and first subsidiary via patterns 11s that connect the first subsidiary patterns 9s to each other. The first subsidiary patterns 9s may be located at the same height (level) as that of the lower wiring patterns 9 and may include the same material as that of the lower wiring patterns 9. The first subsidiary via patterns 11s may be at the same height (level) as that of the lower via patterns 11 and may include the same material as that of the lower via patterns 11. The first subsidiary pattern structure SS1 may be, e.g., a test pattern, an alignment key, or an overlay key.

The lower wiring layer LI may be constituted by or include the primary lower dielectric stack 7m, the edge lower dielectric stack 7e, the lower wiring patterns 9, the lower via patterns 11, the lower guard ring structure GS1, and the first subsidiary pattern structure SS1.

An upper wiring layer UI may be on the lower wiring layer LI. The upper wiring layer UI may include a primary upper dielectric stack 20m and an edge upper dielectric stack 20e that are spaced apart from each other. The primary upper dielectric stack 20m and the edge upper dielectric stack 20e may each include a first upper intermetallic dielectric layer 13, a second upper intermetallic dielectric layer 15, a hydrogen blocking layer 17, and a third upper intermetallic dielectric layer 19 that are sequentially stacked. The first upper intermetallic dielectric layer 13, the second upper intermetallic dielectric layer 15, and the third upper intermetallic dielectric layer 19 may each include a dielectric material that has dielectric constant greater than that of the lower intermetallic dielectric layers 10. The first upper intermetallic dielectric layer 13, the second upper intermetallic dielectric layer 15, and the third upper intermetallic dielectric layer 19 may each have mechanical strength greater than that of the lower intermetallic dielectric layers 10. The first upper intermetallic dielectric layer 13, the second upper intermetallic dielectric layer 15, and the third upper intermetallic dielectric layer 19 may each include, e.g., silicon oxide, tetraethylorthosilicate (TEOS), or high-density plasma (HDP) oxide.

In an implementation, an etch stop layer may be between adjacent ones of the first upper intermetallic dielectric layer 13, the second upper intermetallic dielectric layer 15, and the third upper intermetallic dielectric layer 19. The hydrogen blocking layer 17 may include a material with low hydrogen permeability. In an implementation, the hydrogen blocking layer 17 may include, e.g., aluminum oxide (AlOx), tungsten oxide (WOx), or silicon nitride (SiNx).

A first upper via pattern 12, a sub-pad 14, and a second upper via pattern 22 may be in the primary upper dielectric stack 20m on the device region DR. In an implementation, upper wiring patterns and upper via patterns may also be in the primary upper dielectric stack 20m on the device region DR. The first upper via pattern 12 may penetrate the first upper intermetallic dielectric layer 13, and may connect one of the lower wiring patterns 9 to the sub-pad 14. The sub-pad 14 may have a pad shape when viewed in a plan view and may be covered with the second upper intermetallic dielectric layer 15. The second upper via pattern 22 may penetrate the third upper intermetallic dielectric layer 19, the hydrogen blocking layer 17, and the second upper intermetallic dielectric layer 15, thereby contacting the sub-pad 14.

An upper guard ring structure GS2 may be in the primary upper dielectric stack 20m on the device region DR. The upper guard ring structure GS2 may include fourth guard ring patterns 12g and fifth guard ring patterns 14g. The fourth guard ring patterns 12g may penetrate the first upper intermetallic dielectric layer 13 and may have the same height and material as those of the first upper via pattern 12. The fifth guard ring patterns 14g may have the same height and material as those of the sub-pad 14, and may be covered with the second upper intermetallic dielectric layer 15. As shown in FIG. 1, the fourth guard ring patterns 12g and the fifth guard ring patterns 14g may surround the device region DR. The upper guard ring structure GS2 may help protect the upper wiring layer UI on the device region DR against moisture or physical cracks.

A second subsidiary pattern structure SS2 may be in the edge upper dielectric stack 20e. The second subsidiary pattern structure SS2 may include second and third subsidiary via patterns 12s and 22s and a second subsidiary pattern 14s between the second and third subsidiary via patterns 12s and 22s. The second subsidiary pattern 14s may have the same height and material as those of the sub-pad 14, and may be covered with the second upper intermetallic dielectric layer 15. The second subsidiary via patterns 12s may penetrate the first upper intermetallic dielectric layer 13, and may have the same height and material as those of the first upper via pattern 12. The third subsidiary via patterns 22s may penetrate the third upper intermetallic dielectric layer 19, the hydrogen blocking layer 17, and the second upper intermetallic dielectric layer 15, thereby contacting the second subsidiary pattern 14s. The second subsidiary pattern structure SS2 may be, e.g., a test pattern, an alignment key, or an overlay key.

The primary upper dielectric stack 20m may have a sidewall aligned (e.g., coplanar) with that of the primary lower dielectric stack 7m. The edge upper dielectric stack 20e may have a sidewall aligned with that of the edge lower dielectric stack 7e.

A separation dielectric pattern 27s may separate the wiring layer IL into a primary wiring structure ILM and an edge wiring structure ILE. A space between the primary wiring structure ILM and the edge wiring structure ILE may be defined as a first trench TR1. When viewed in a plan view, the separation dielectric pattern 27s may surround the device region DR. A first capping layer 25 may be between the separation dielectric pattern 27s and the primary wiring structure ILM, between the separation dielectric pattern 27s and the edge wiring structure ILE, and between the separation dielectric pattern 27s and the device layer DL.

The separation dielectric pattern 27s and the first capping layer 25 may each include a dielectric material that has dielectric constant and mechanical strength greater than those of the lower intermetallic dielectric layers 10. The first capping layer 25 (e.g., a material forming the first capping layer 25) may have a density greater than that of the separation dielectric pattern 27s (e.g., a material forming the separation dielectric pattern 27s). In an implementation, the first capping layer 25 may include, e.g., high density plasma (HDP) oxide, and the separation dielectric pattern 27s may include, e.g., tetraethylorthosilicate (TEOS).

In some cases, the lower wiring layer LI may include the lower intermetallic dielectric layers 10 whose mechanical strength is low, and a physical crack could easily propagate along the lower intermetallic dielectric layers 10 to the device region DR. In an implementation, the first trench TR1 and the separation dielectric pattern 27s and the first capping layer 25 therein may help prevent a physical crack from propagating from the edge region ER toward the device region DR. In some cases, when lower intermetallic dielectric layers 10 include a porous dielectric material, moisture could be easily introduced into the semiconductor chip 100. In an implementation, the first trench TR1 and the separation dielectric pattern 27s and the first capping layer 25 therein may help prevent moisture from being introduced into the device region DR from an outermost side of the semiconductor chip 100. As a result, the semiconductor chip 100 may exhibit increased reliability.

The primary wiring structure ILM may cover the device region DR and a portion of the edge region ER adjacent to the device region DR. The edge wiring structure ILE may be on the edge region ER. A top surface of the device layer DL may be exposed on or at a side of the primary wiring structure ILM and a side of the edge wiring structure ILE.

The primary wiring structure ILM may include the primary lower dielectric stack 7m, the lower wiring patterns 9, the lower via patterns 11, the lower guard ring structure GS1, the primary upper dielectric stack 20m, the first and second upper via patterns 12 and 22, the sub-pad 14, and the upper guard ring structure GS2. The edge wiring structure ILE may include the edge lower dielectric stack 7e, the first subsidiary pattern structure SS1, the edge upper dielectric stack 20e, and the second subsidiary pattern structure SS2.

The pad layer PL may be on the wiring layer IL. The pad layer PL may include a pad pattern 21p on the device region DR and a third subsidiary pattern 21s on the edge region ER. The third subsidiary pattern 21s may be a test pattern or an alignment key. In an implementation, as illustrated in FIG. 1, the third subsidiary pattern 21s may be provided in plural, and the plurality of third subsidiary patterns 21s may be linearly arranged on the edge region ER.

The pad pattern 21p may be electrically connected through the second upper via pattern 22 to the sub-pad 14. The third subsidiary pattern 21s may be electrically connected to the second subsidiary pattern structure SS2. A top surface of the wiring layer IL may be exposed on or at opposite sides of each of the pad pattern 21p and the third subsidiary pattern 21s.

A hard mask pattern 23 may cover the top surface of the wiring layer IL and may also cover sidewalls and top surfaces of the pad pattern 21p and the third subsidiary pattern 21s. The hard mask pattern 23 may include, e.g., high-density plasma (HDP) oxide, undoped silicate glass (USG), tetraethylorthosilicate (TEOS), SiN, SiO$_2$, SiOC, SiON, or SiCN.

The first capping layer 25 may be conformally formed on the hard mask pattern 23. A portion of the first capping layer 25 may penetrate the wiring layer IL and contact the device layer DL. On an outermost side of the edge region ER, the first capping layer 25 may cover the sidewall of the third subsidiary pattern 21s, the sidewall of the edge wiring structure ILE, and the top surface of the device layer DL.

A buried dielectric layer 27 may be on the first capping layer 25. A portion of the buried dielectric layer 27, as discussed above, may be inserted into the first trench TR1 to constitute the separation dielectric pattern 27s. The buried dielectric layer 27 may include, e.g., tetraethylorthosilicate (TEOS).

On an outermost side of the edge region ER, the first capping layer 25 may have an upper outer sidewall 25us and a lower outer sidewall 25bs that are offset from each other (e.g., discontinuous or unaligned). The upper outer sidewall 25us may be exposed. The lower outer sidewall 25bs may be in contact with the buried dielectric pattern 27b. A portion of the buried dielectric layer 27 may be the buried dielectric pattern 27b, and the buried dielectric layer 27 and the buried dielectric pattern 27b may include the same material. The buried dielectric pattern 27b may have a density less than that of the first capping layer 25. A top surface 27bu of the buried dielectric pattern 27b may be located at substantially the same level as that of a bottom end 25us of the upper outer sidewall 25us of the first capping layer 25.

The first capping layer 25 may have an almost constant thickness regardless of position. In an implementation, the first capping layer 25 may have a first thickness T1 below the separation dielectric pattern 27s and a second thickness T2 below the buried dielectric pattern 27b. The second thickness T2 may be almost identical to the first thickness T1. In an implementation, the second thickness T2 may be about 0.9 times to about 1.1 times the first thickness T1.

A second capping layer 29 may be on the buried dielectric layer 27. The second capping layer 29 may include, e.g., silicon nitride. An upper passivation layer 35 may be on the second capping layer 29. The upper passivation layer 35 may include a first upper passivation layer 31 and a second upper passivation layer 33 that are sequentially stacked. The first upper passivation layer 31 may include, e.g., high-density plasma (HDP) oxide, undoped silicate glass (USG), tetraethylorthosilicate (TEOS), SiN, SiO$_2$, SiOC, SiON, or SiCN. The second upper passivation layer 33 may include, e.g., SiCN.

On the device region DR, a portion of the first upper passivation layer 31 may penetrate the second capping layer 29, the buried dielectric layer 27, the first capping layer 25, and the hard mask pattern 23, thereby contacting the pad pattern 21p. On the edge region ER, another portion of the first upper passivation layer 31 may penetrate the second capping layer 29, the buried dielectric layer 27, the first capping layer 25, and the hard mask pattern 23, thereby contacting the third subsidiary pattern 21s.

On the device region DR, an upper bonding pad 37 may penetrate the second upper passivation layer 33 and the first upper passivation layer 31, thereby contacting the pad pattern 21p. The upper bonding pad 37 may have a top surface coplanar with a top surface 33u of the second upper passivation layer 33.

The top surface 33u of the second upper passivation layer 33 and the top surface 27bu of the buried dielectric pattern 27b may form a step difference or a stepped region SDR (e.g., the top surface 33u of the second upper passivation layer 33 may be at a higher level than the top surface 27bu of the buried dielectric pattern 27b to form a step structure, the stepped region SDR). The stepped region SDR may be formed along an edge of the semiconductor chip 100, when viewed in a plan view as shown in FIG. 1. The stepped region SDR may surround the device region DR.

The second upper passivation layer 33, the first upper passivation layer 31, the second capping layer 29, and the buried dielectric layer 27 may have sidewalls aligned with the upper outer sidewall 25us of the first capping layer 25. The buried dielectric pattern 27b, the device interlayer dielectric layer 3 thereunder, and the substrate 1 may have sidewalls that are aligned with each other.

In an implementation, the semiconductor chip 100 may have an outermost surface that is blocked or covered by the first capping layer 25 and the buried dielectric pattern 27b, which may facilitate prevention of horizontal crack and moisture absorption.

The pad layer PL may include the second upper passivation layer 33, the first upper passivation layer 31, the second capping layer 29, the buried dielectric layer 27, the first capping layer 25, and the hard mask pattern 23.

The second surface 1a of the substrate 1 may be covered with a lower passivation layer 44. The lower passivation layer 44 may include a first lower passivation layer 40 and a second lower passivation layer 42 that are sequentially stacked on the second surface 1a of the substrate 1. The first lower passivation layer 40 may include, e.g., silicon oxide or silicon nitride. The second lower passivation layer 42 may include, e.g., SiCN.

The device region DR may include a through electrode TSV that penetrates the device interlayer dielectric layer 3, the substrate 1, and the first lower passivation layer 40. The through electrode TSV may be in contact with one of the lower wiring patterns 9. A through dielectric layer TL may be between the through electrode TSV and the substrate 1. The through dielectric layer TL may include, e.g., silicon oxide.

A lower bonding pad 46 may be in the second lower passivation layer 42 and may be in contact with the through electrode TSV. The lower bonding pad 46 may have a bottom surface coplanar with that of the second lower passivation layer 42.

Figure 3:
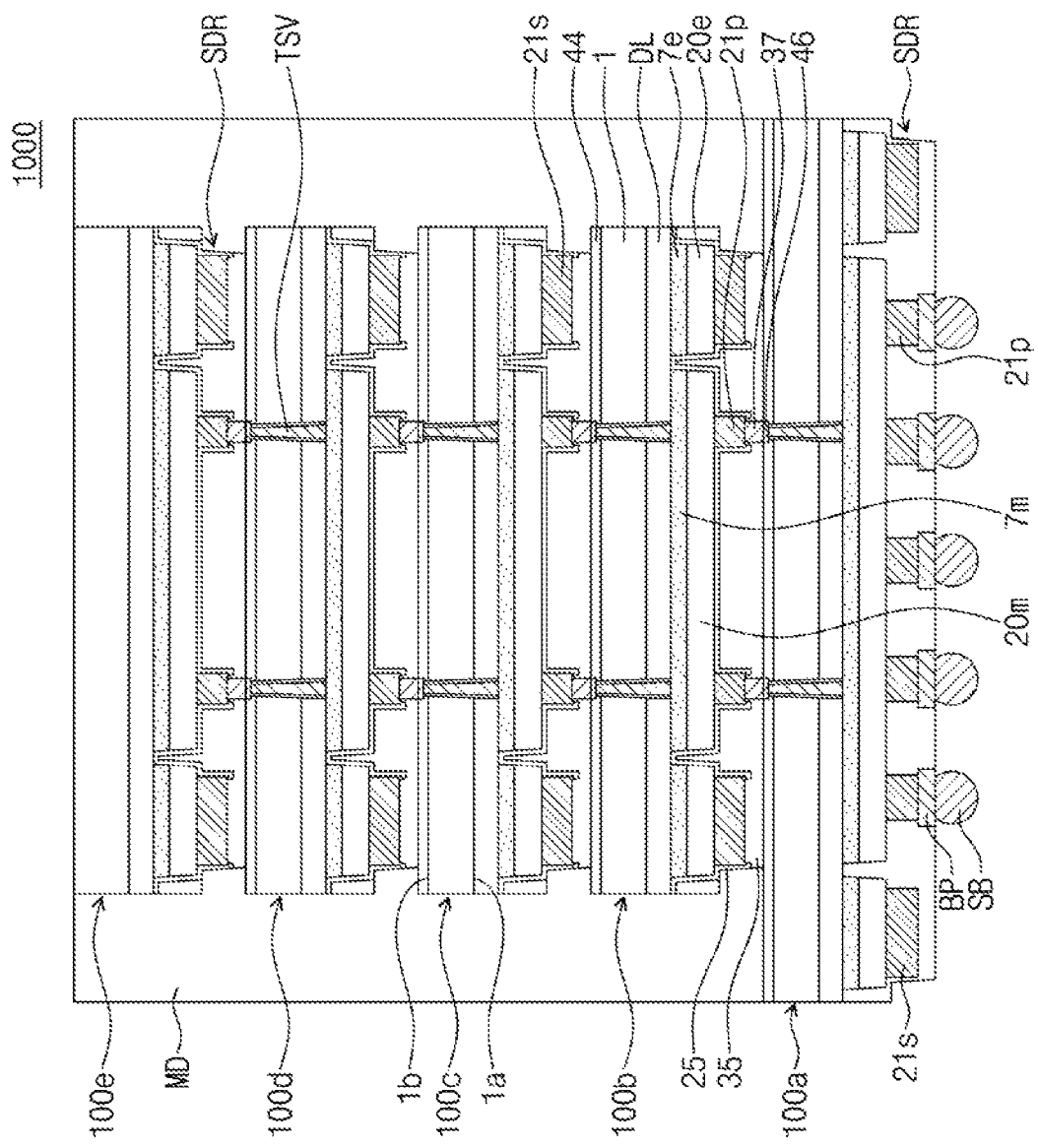
FIG. 3 illustrates a cross-sectional view of a semiconductor package according to some embodiments.

FIG. 3 illustrates a cross-sectional view of a semiconductor package according to some embodiments.

Referring to FIG. 3, a semiconductor package 1000 according to the present embodiment may include first to fifth semiconductor chips 100a to 100e that are sequentially stacked. The first semiconductor chip 100a may be of a different type from the second to fifth semiconductor chips 100b to 100e. The first semiconductor chip 100a may be, e.g., a logic circuit chip. The second to fifth semiconductor chips 100b to 100e may the same (e.g., same structured) memory chip. In an implementation, the memory chip may be, e.g., DRAM, NAND Flash, SRAM, MRAM, or PRAM. In an implementation, the package may have a structure where one logic circuit chip and four memory chips are stacked, or the number of the logic circuit chip and the number of the memory chips may be variously changed. The first semiconductor chip 100a may have a width greater than those of the second to fifth semiconductor chips 100b to 100e. The semiconductor package 1000 may be a high bandwidth memory (HBM) chip.

A mold layer MD may cover a top surface of the first semiconductor chip 100a and lateral surfaces of the second to fifth semiconductor chips 100b to 100e. The mold layer MD may include a dielectric resin, e.g., an epoxy molding compound (EMC). The mold layer MD may further include fillers, and the fillers may be dispersed in the dielectric resin. The fillers may include, e.g., silicon oxide (SiO$_2$). The mold layer MD may have a top surface coplanar with the second surface 1a of the substrate 1 included in the fifth semiconductor chip 100e.

Each of the first to fifth semiconductor chips 100a to 100e may have characteristics identical or similar to those of the semiconductor chip 100 discussed with reference to FIGS. 1 and 2. In an implementation, the semiconductor package 1000 may have a structure in which the semiconductor chip 100 of FIGS. 1 and 2 is provided in plural, and in which the plurality of semiconductor chips 100 of FIGS. 1 and 2 are turned upside down and stacked. Identically or similarly to the semiconductor chip 100 of FIGS. 1 and 2, each of the first to fifth semiconductor chips 100a to 100e may include a circuit structure CS on the first surface 1a of the substrate 1. The circuit structure CS has already been described in FIGS. 1 and 2, and a repeated description thereof may be omitted. Hereinafter, because the semiconductor chip 100 is in a state of being turned upside down, terms "upper" and "lower" are interchangeable based on the point of view in describing FIG. 2.

The lower bonding pad 46 of an underlying one of the first to fifth semiconductor chips 100a to 100e may be in contact with the upper bonding pad 37 of an overlying chip. In an implementation, the lower passivation layer 44 of the underlying chip may be in contact with the upper passivation layer 35 of the overlying chip.

Each of the first to fifth semiconductor chips 100a to 100e may have the stepped region SDR at its edge region. The stepped regions SDR of the second to fifth semiconductor chips 100b to 100e may be filled with the molding layer MD. The mold layer MD may cover the buried dielectric pattern 27b and an exposed outer sidewall of the first capping layer 25 included in each of the second to fifth semiconductor chips 100b to 100e.

The first semiconductor chip 100a may include a bonding pad BP in contact with the pad pattern 21p. An external connection terminal SB may be bonded to the bonding pad BP of the first semiconductor chip 100a. The external connection terminal SB may include, e.g., a conductive bump, a conductive pillar, or a solder layer. The external connection terminal SB may include, e.g., copper, nickel, tin, lead, or silver.

The fifth semiconductor chip 100e at the top position may include neither the through electrode TSV nor the lower bonding pad 46. Other configurations may be identical or similar to those discussed with reference to FIGS. 1 and 2.

The semiconductor package 1000 according to the present embodiment may include the semiconductor chips 100a to 100e whose reliabilities are improved as discussed with reference to FIGS. 1 and 2, and thus may increase in reliability.

Figure 4:
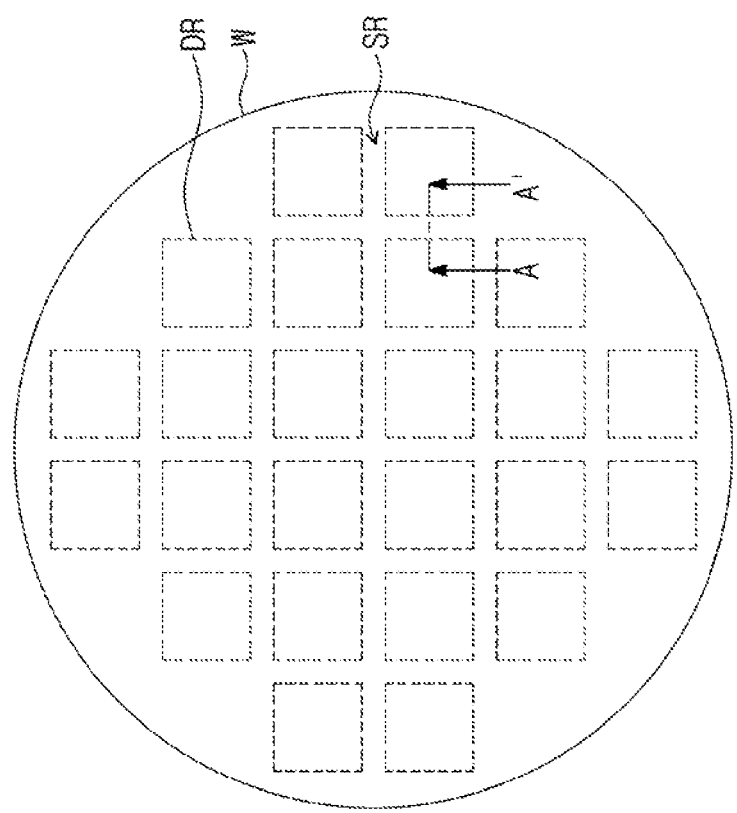
FIG. 4 illustrates a plan view of a wafer.

FIG. 4 illustrates a plan view showing a wafer. FIGS. 5A to 5L illustrate cross-sectional views of stages in a method of fabricating a semiconductor chip having the cross-section of FIG. 2. FIGS. 5A to 5L show process cross-sections taken along line A-A' of FIG. 5.

Figure 5A:
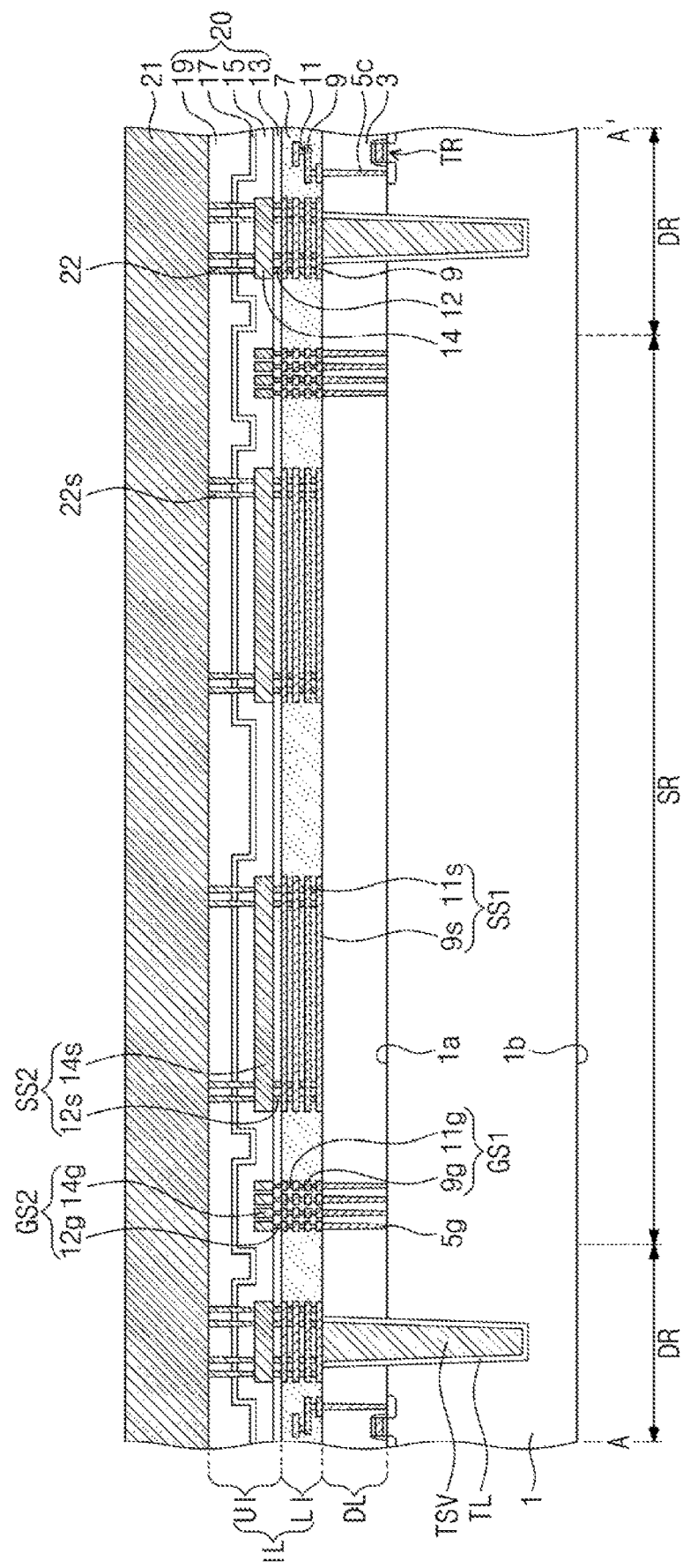
FIGS. 5A to 5L illustrate cross-sectional views of stages in a method of fabricating a semiconductor chip of FIG. 2.

Referring to FIGS. 4 and 5A, a plurality of device regions DR may be arranged on a wafer W. The device regions DR may each be called a chip region. A scribe lane region SR may be between the device regions DR. The wafer W may correspond to the substrate 1 of FIG. 5A. An ordinary procedure may be performed to form a device layer DL on the first surface 1a of the substrate 1. The device layer DL and the substrate 1 may be etched to form holes for through electrodes, and through electrodes TSV and through dielectric layers TL may be formed in the holes.

An ordinary procedure may be performed to form a wiring layer IL on the device layer DL. The wiring layer IL may include a lower wiring layer LI and an upper wiring layer UI. The lower wiring layer LI may include a lower dielectric stack 7 including a plurality of lower intermetallic dielectric layers 10 illustrated in FIG. 2. The lower dielectric stack 7 may be provided therein with lower wiring patterns 9, lower via patterns 11, a lower guard ring structure GS1, and a first subsidiary pattern structure SS1. The upper wiring layer UI may include an upper dielectric stack 20. The upper dielectric stack 20 may be provided therein with a sub-pad 14, an upper guard ring structure GS2, and a second subsidiary pattern structure SS2. A metal-containing layer 21 may be formed on the third upper intermetallic dielectric layer 19 of the upper dielectric stack 20. The metal-containing layer 21 may include, e.g., aluminum.

Figure 5B:
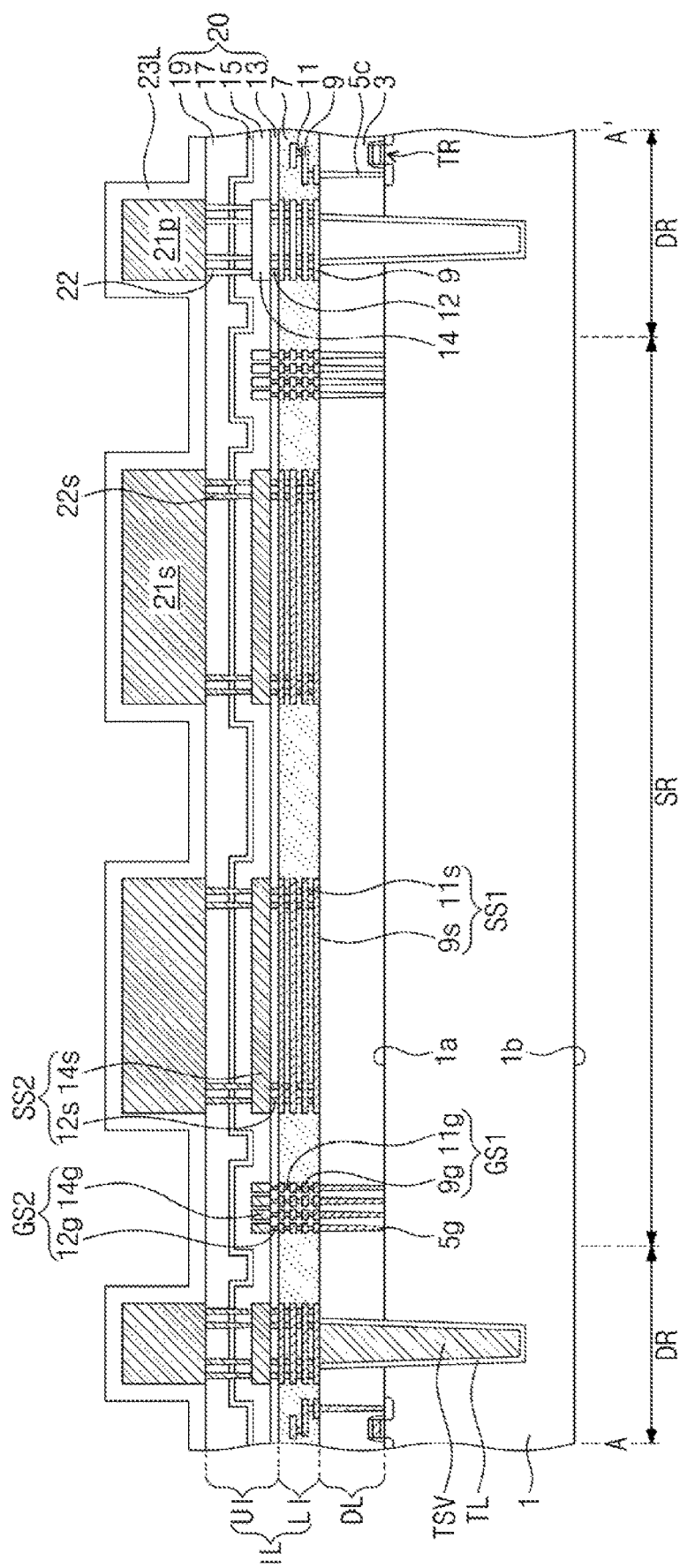

Referring to FIGS. 5A and 5B, the metal-containing layer 21 may be etched to form a pad pattern 21p on the device region DR and to form a third subsidiary pattern 21s on the scribe lane region SR. A hard mask layer 23L may be conformally formed on the third upper intermetallic dielectric layer 19 of the upper dielectric stack 20. The hard mask layer 23L may include, e.g., tetraethylorthosilicate (TEOS).

Figure 5C:
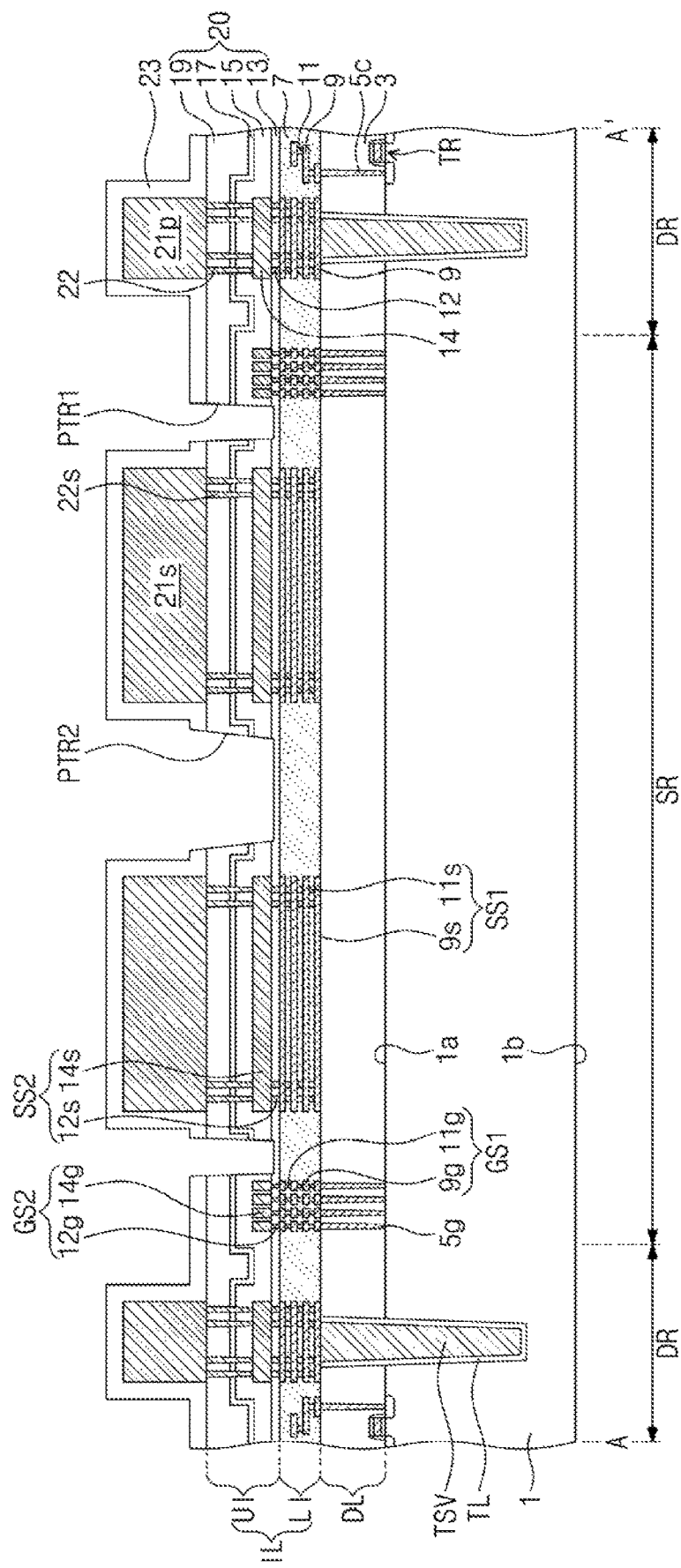

In an implementation, referring to FIGS. 5B and 5C, a mask pattern may be formed on the hard mask layer 23L. The mask pattern may include, e.g., a photoresist pattern or a spin-on-hard mask (SOH) pattern. The mask pattern may be used as an etching mask to sequentially etch the hard mask layer 23L, the third upper intermetallic dielectric layer 19, the hydrogen blocking layer 17, and the second upper intermetallic dielectric layer 15 of the upper dielectric stack 20 that underlies the hard mask layer 23L, and thus preliminary trenches PTR1 and PTR2 may be formed to expose the first upper intermetallic dielectric layer 13. The preliminary trenches PTR1 and PTR2 may include a first preliminary trench PTR1 between the upper guard ring structure GS2 and its adjacent second subsidiary pattern structure SS2, and may also include a second preliminary trench PTR2 between the second subsidiary pattern structures SS2. In this step, the hard mask layer 23L may be etched to form a hard mask pattern 23. The mask pattern may be removed.

Figure 5D:
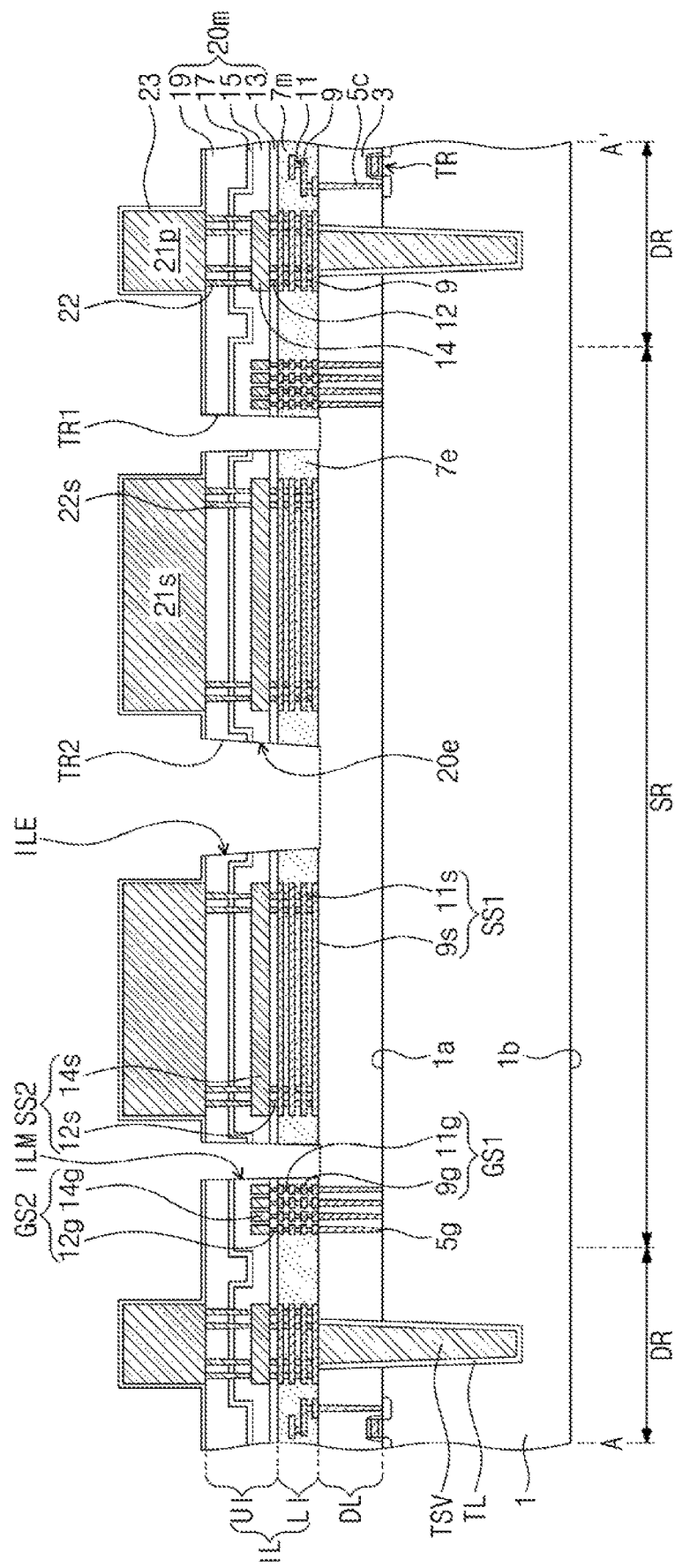

Referring to FIGS. 5C and 5D, the hard mask pattern 23 may be used as an etching mask for an etching process performed on the first upper intermetallic dielectric layer 13 and the lower dielectric stack 7, and thus the wiring layer IL may be divided into primary wiring structures ILM and edge wiring structures ILE. The primary wiring structure ILM may include a primary lower dielectric stack 7m and a primary upper dielectric stack 20m that are sequentially stacked. The edge wiring structure ILE may include an edge lower dielectric stack 7e and an edge upper dielectric stack 20e that are sequentially stacked. The etching process may form a first trench TR1 between the primary wiring structure ILM and its adjacent edge wiring structure ILE and a second trench TR2 between neighboring edge wiring structures ILE. The etching process may reduce a thickness of the hard mask pattern 23. In an implementation, the hard mask pattern 23 may all be removed to expose a top surface of the wiring layer IL.

Figure 5E:
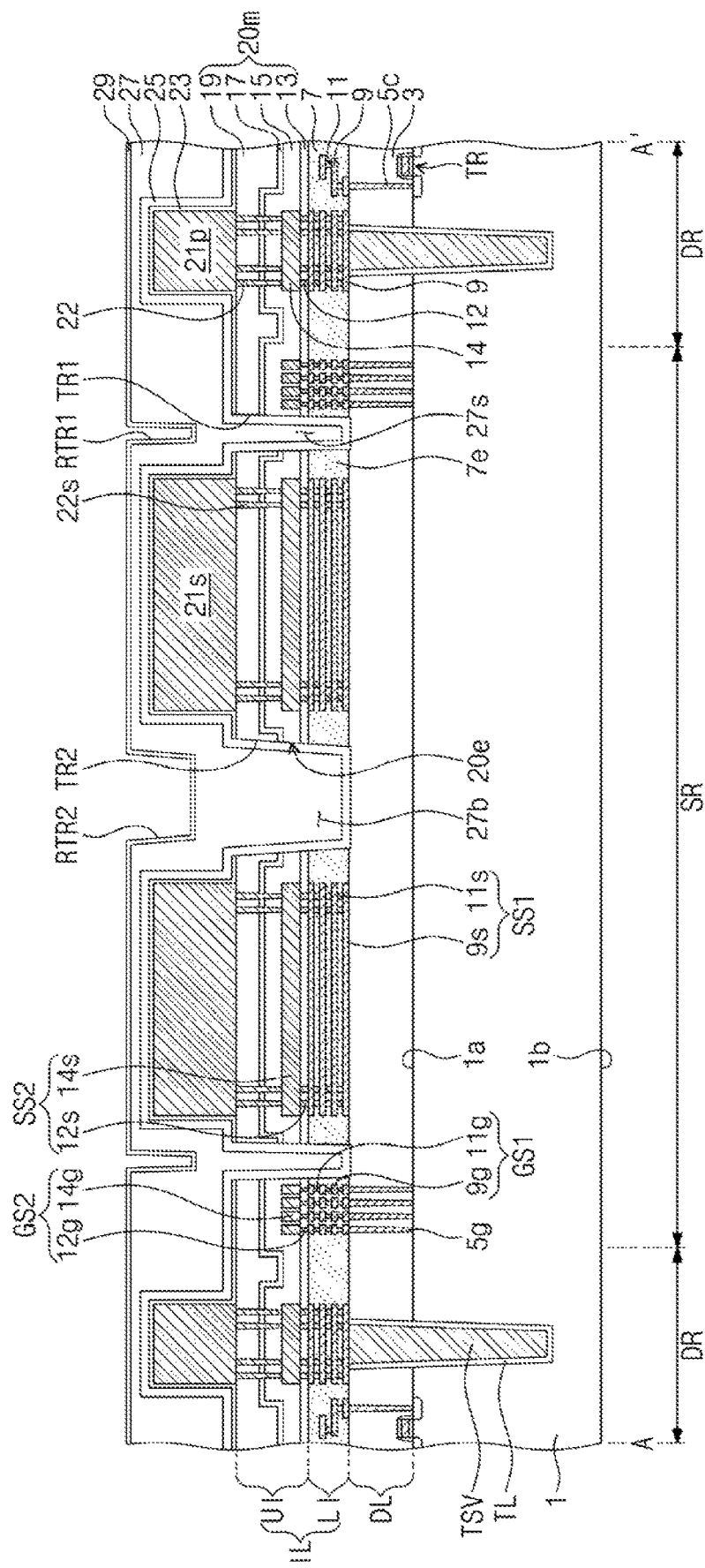

Referring to FIG. 5E, a first capping layer 25 may be conformally formed on the first surface 1a of the substrate 1. A buried dielectric layer 27 may be formed on the first capping layer 25. The buried dielectric layer 27 may be formed of, e.g., tetraethylorthosilicate (TEOS). The buried dielectric layer 27 may fill the first and second trenches TR1 and TR2. A separation dielectric pattern 27s may be defined to indicate the portion of the buried dielectric layer 27 that fills the first trench TR1. In an implementation, a buried dielectric pattern 27b may be defined to indicate the portion of the buried dielectric layer 27 that fills the second trench TR2.

A planarization process may be performed on the buried dielectric layer 27. Therefore, the buried dielectric layer 27 may have a relatively small thickness and a flat top surface on the pad pattern 21p and the third subsidiary pattern 21s. A second capping layer 29 may be formed on the buried dielectric layer 27. The second capping layer 29 may include, e.g., silicon oxide. First and second transferred trenches RTR1 and RTR2, which are transferred from the (e.g., remnants of the filled) first and second trenches TR1 and TR2, may be formed on or at a top surface of the second capping layer 29.

Figure 5F:
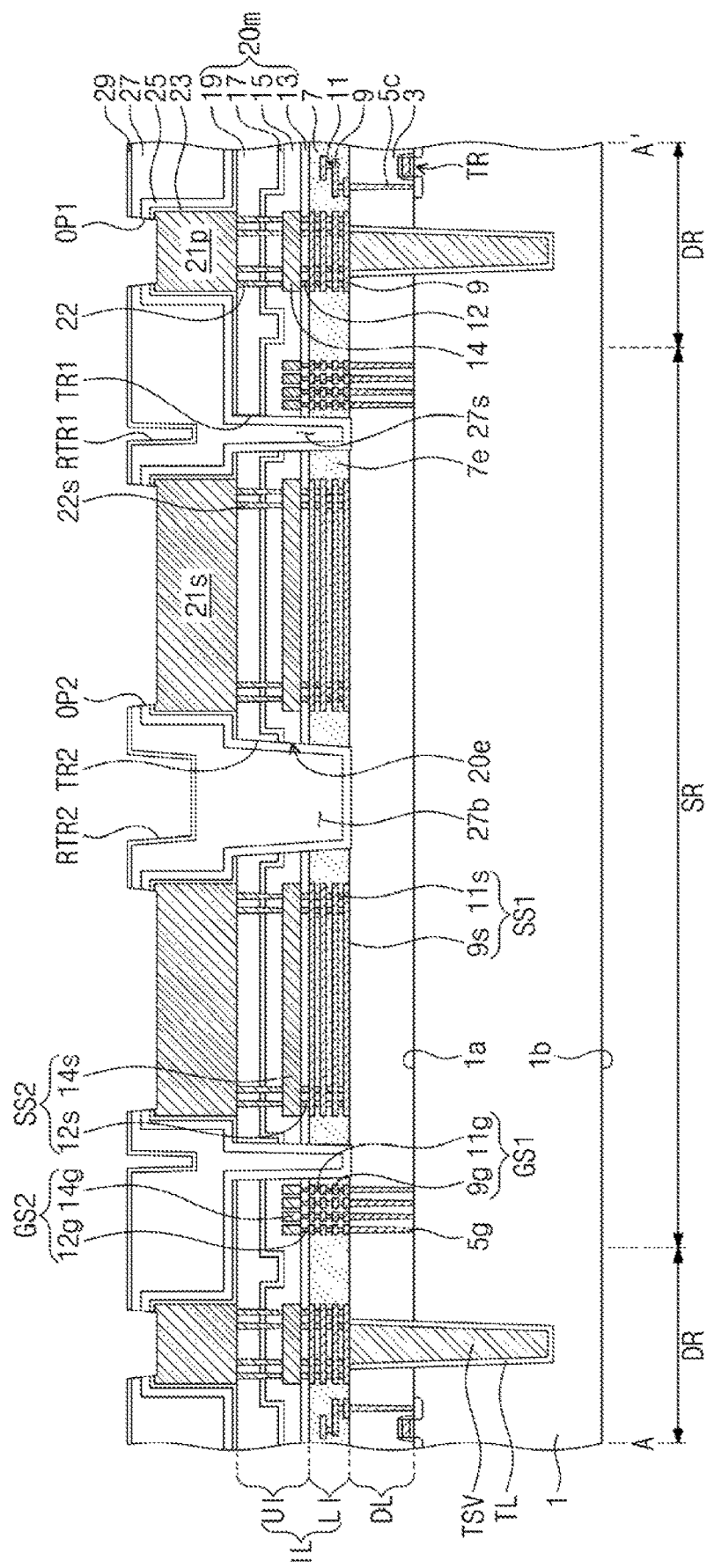

Referring to FIG. 5F, the second capping layer 29, the buried dielectric layer 27, the first capping layer 25, and the hard mask pattern 23 may be sequentially etched to form a first opening OP1 and a second opening OP2 that respectively expose the pad pattern 21p and the third subsidiary pattern 21s.

When the third subsidiary pattern 21s is a test pattern, a test process may be executed through the second opening OP2. In an implementation, the test process may be fulfilled in such a way that a probe needle of a probe card may contact a surface of the third subsidiary pattern 21s exposed to the second opening OP2, and then test signals may be applied. The test process may measure electrical properties of semiconductor devices to determine whether each process is normally performed and to ascertain characteristics of unit device, e.g., transistor, metal wire resistance, via resistance, or the like.

Figure 5G:
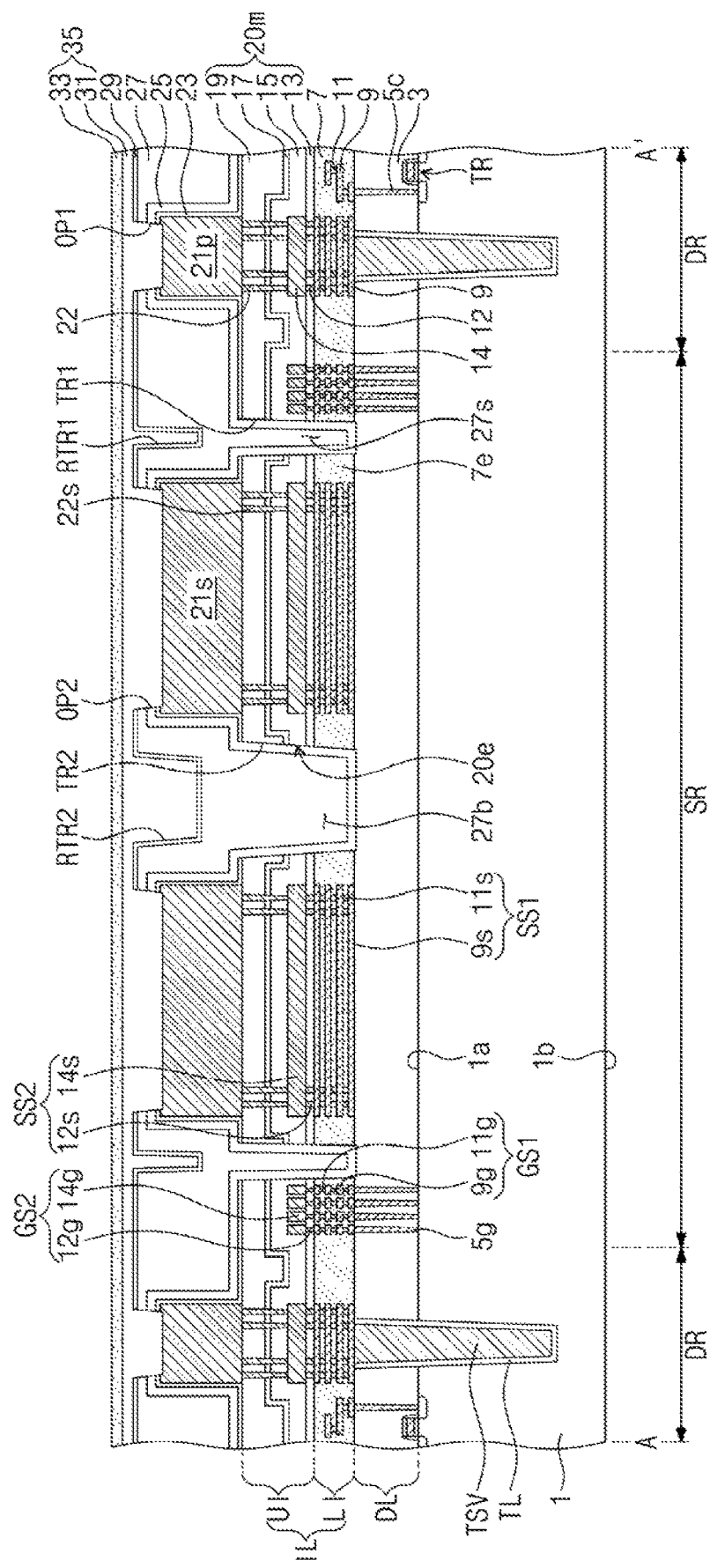

Referring to FIG. 5G, first and second upper passivation layers 31 and 33 may be sequentially stacked on the second capping layer 29. The first upper passivation layer 31 may fill the first opening OP1 and the second opening OP2.

Figure 5H:
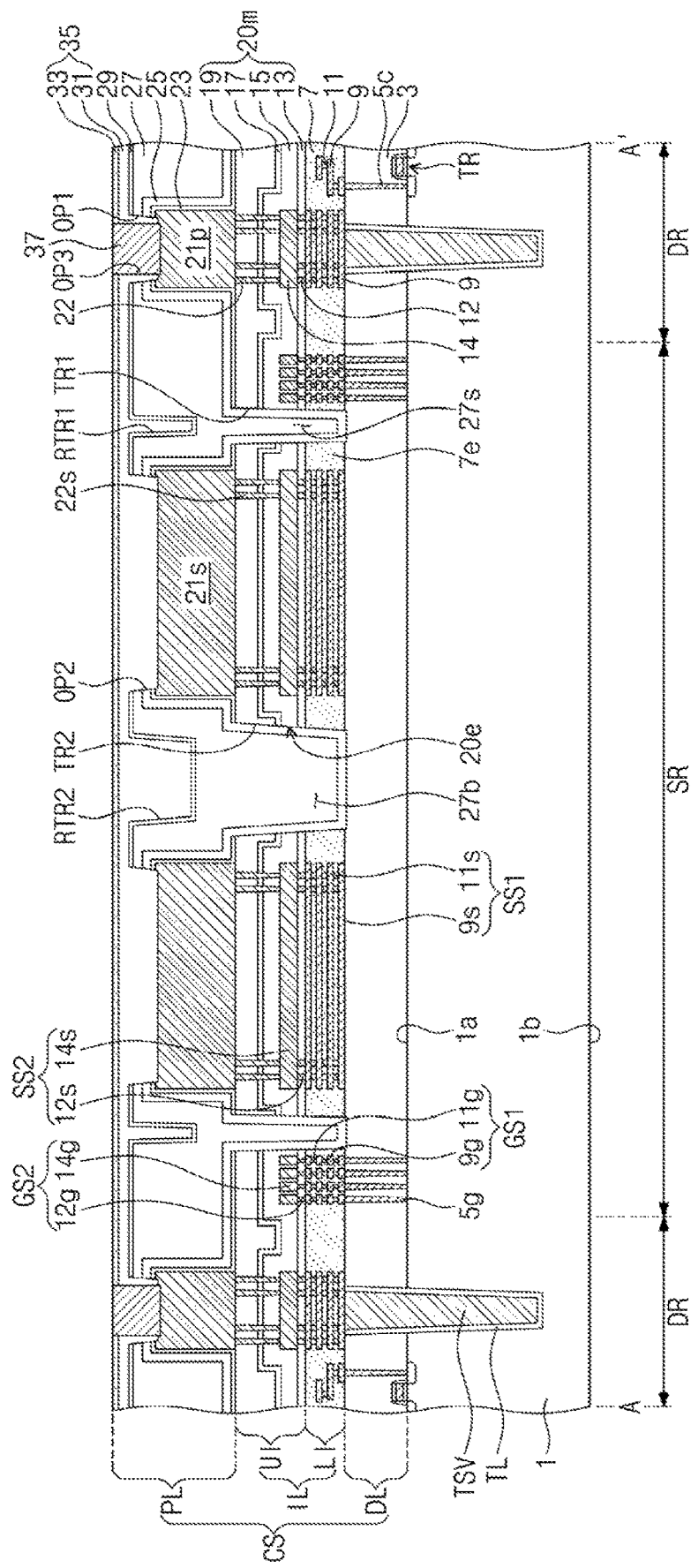

Referring to FIG. 5H, the first and second upper passivation layers 31 and 33 may be etched to form a third opening OP3 that exposes the pad pattern 21p. The third opening OP3 may be formed to overlap the first opening OP1 and to have a width less than that of the first opening OP1. In an implementation, the formation of the first opening OP1 may remove the hard mask pattern 23, the first capping layer 25, the buried dielectric layer 27, and the second capping layer 29 on the pad pattern 21p, and it may be enough to etch only the first and second upper passivation layers 31 and 33 when the third opening OP3 is formed. In an implementation, the third opening OP3 may be easily formed compared to a case where the hard mask pattern 23, the first capping layer 25, the buried dielectric layer 27, and the second capping layer 29 on the pad pattern 21p without the formation of the first opening OP1.

A seed layer may be formed, and a plating process may be performed to form a conductive layer that fills the third opening OP3, and thereafter a chemical mechanical polishing (CMP) process may be executed to form an upper bonding pad 37 and to expose the second upper passivation layer 33. The CMP process may reduce a thickness of the second upper passivation layer 33.

Figure 5I:
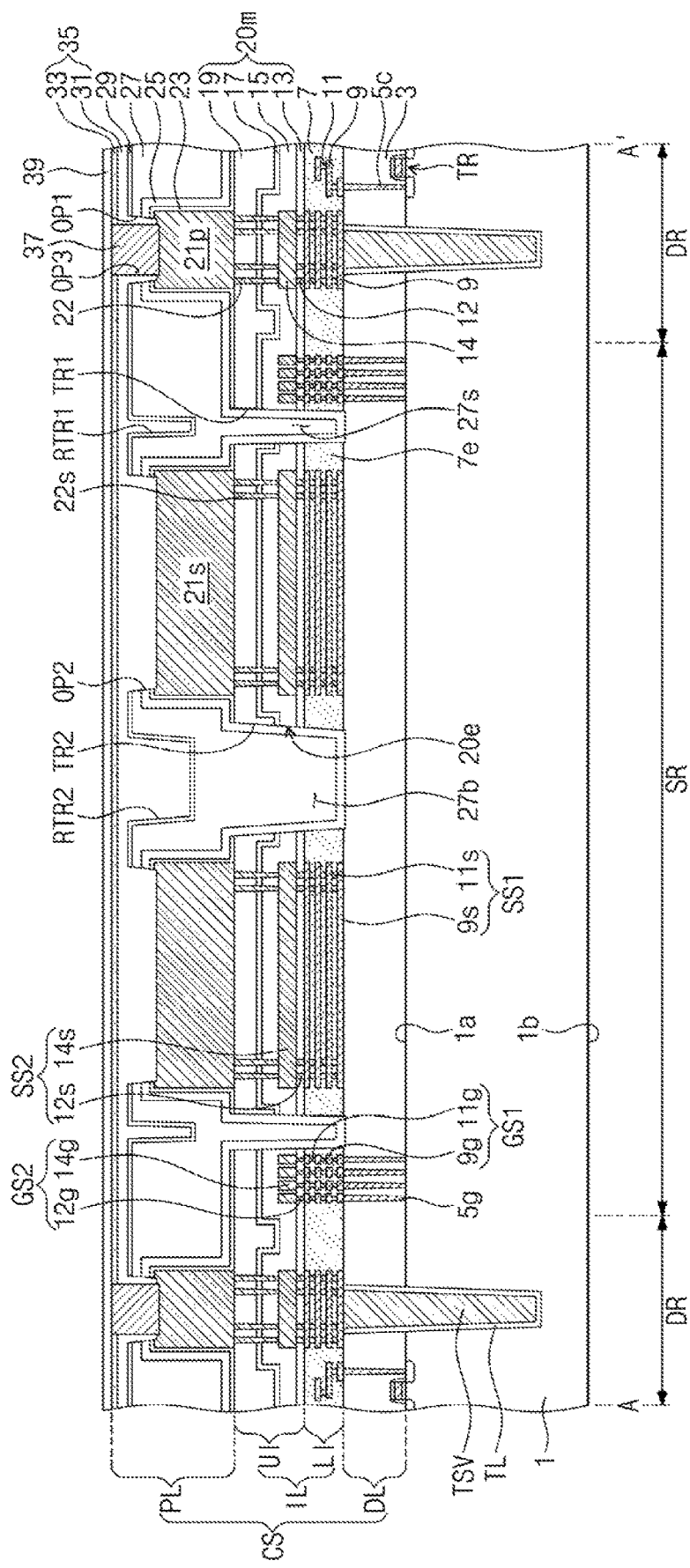

Referring to FIG. 5I, a protection layer 39 may be formed on the second upper passivation layer 33. The protection layer 39 may include, e.g., tetraethylorthosilicate (TEOS), SiN, $SiO_2$, high density plasma (HDP) oxide, SiON, or SiCN. The protection layer 39 may cover and protect the upper bonding pad 37.

Figure 5J:
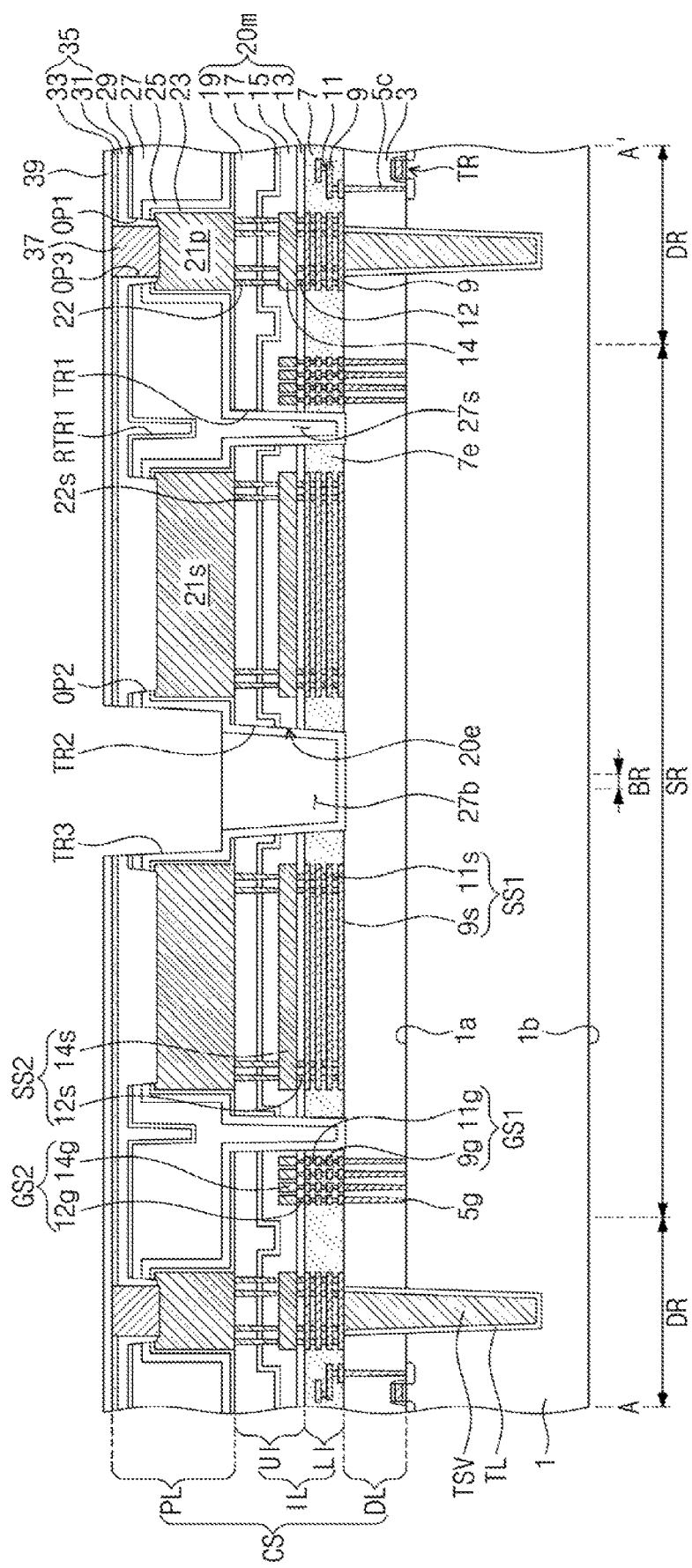

Referring to FIGS. 5I and 5J, on a position that overlaps the second trench TR2 on a breaking region BR or a center of the scribe lane region SR, a third trench TR3 may be formed by etching the protection layer 39, the second upper passivation layer 33, the first upper passivation layer 31, the second capping layer 29, and the buried dielectric layer 27. An upper outer sidewall of the first capping layer 25 may be exposed to a sidewall of the third trench TR3. A top surface of the buried dielectric pattern 27b may be exposed on a floor of the third trench TR3. The protection layer 39 may cover and protect the upper bonding pad 37 against etching damage in the etching process.

Figure 5K:
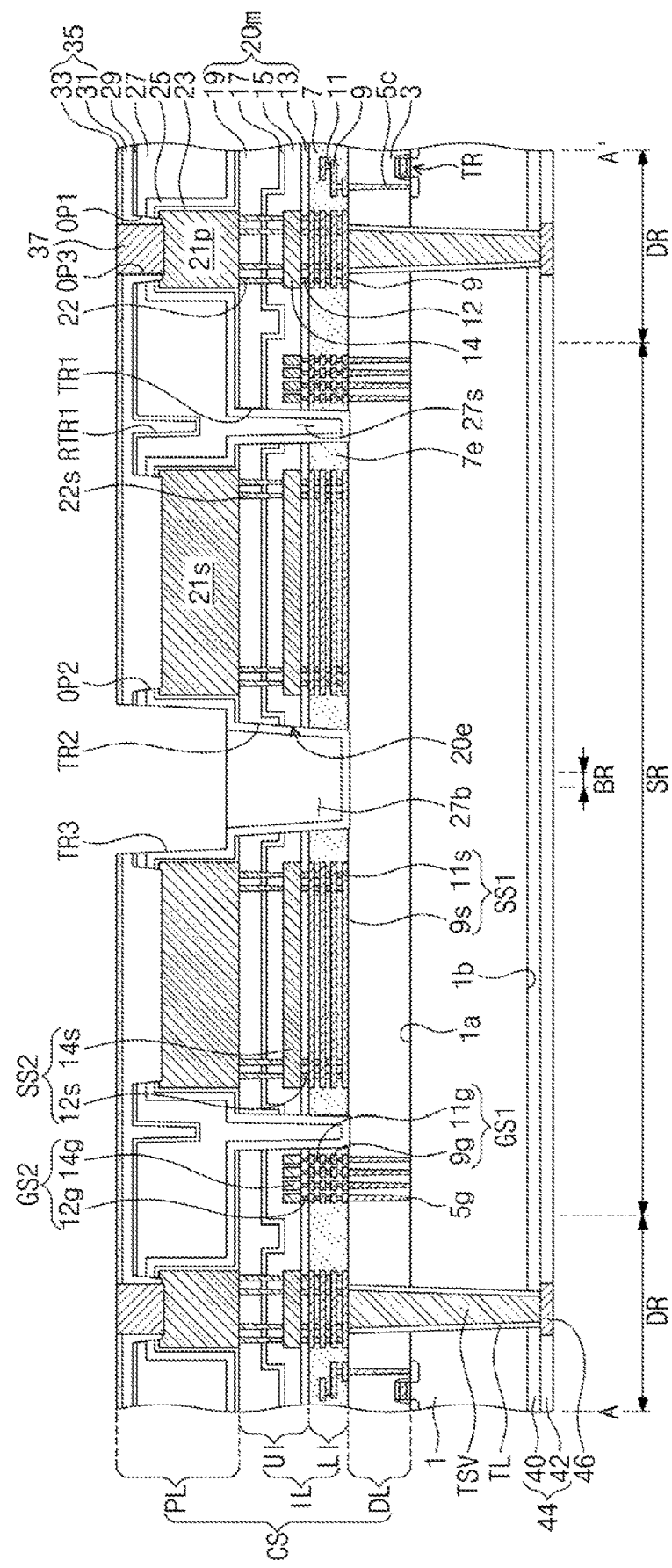

Referring to FIGS. 5J and 5K, the second surface 1a of the substrate 1 may undergo a back grinding process to expose a bottom surface of the through dielectric layer TL. The second surface 1a of the substrate 1 may further be partially removed to expose a lateral surface of the through dielectric layer TL. A first lower passivation layer 40 may be stacked on the second surface 1a of the substrate 1, and then a chemical mechanical polishing (CMP) may be performed to expose a bottom surface of the through electrode TSV. A second lower passivation layer 42 may be formed on the first lower passivation layer 40. A lower bonding pad 46 may be formed on the second lower passivation layer 42, contacting the through electrode TSV.

Figure 5L:
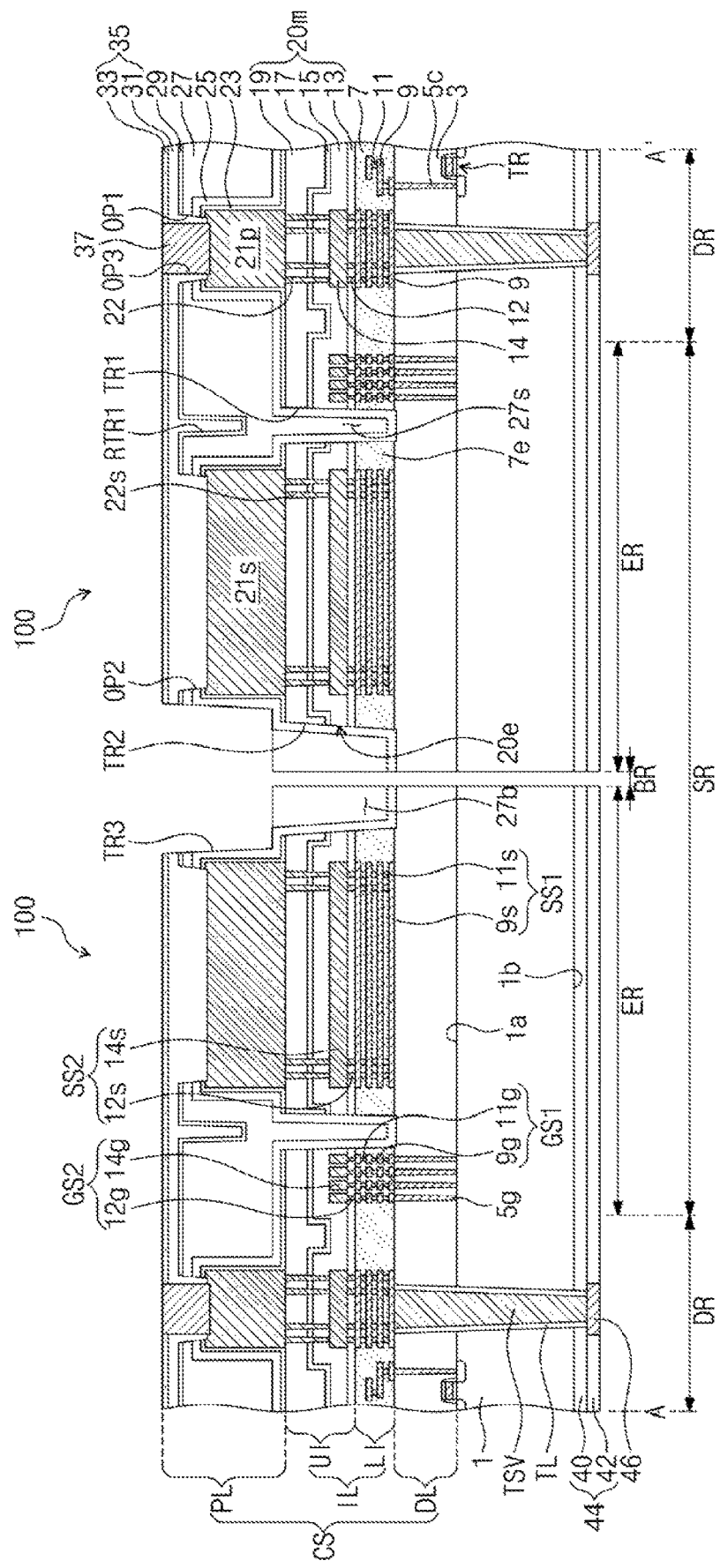

Referring to FIGS. 5K and 5L, a laser (e.g., stealth laser) may be used to perform a sawing process to dice the buried dielectric pattern 27b exposed on a center at the floor of the third trench TR3 on the breaking region BR and also to sequentially dice the first capping layer 25, the device interlayer dielectric layer 3, the substrate 1, and the lower passivation layer 44 that underlie the buried dielectric pattern 27b. Therefore, the semiconductor chips 100 of FIG. 2 may be separated from each other. A portion of the scribe lane region SR may be the edge region ER of FIG. 2.

No physical crack may occur, e.g., because lower intermetallic dielectric layers 10 of the edge lower dielectric stack 7e may not exposed in the sawing process. Even if a physical crack were to occur, the separation dielectric pattern 27s may help prevent the physical crack from propagating to the device region DR. In an implementation, the buried dielectric pattern 27b and the separation dielectric pattern 27s may doubly, e.g., together, help prevent physical lateral cracks. In an implementation, the buried dielectric pattern 27b, the separation dielectric pattern 27s, and the guard ring structures GS1 and GS2 may triply (e.g., together) help prevent moisture absorption. Accordingly, defects of a semiconductor chip may be reduced to help increase a yield and to improve reliability of the semiconductor chip.

If a blade were to be used instead of the laser in a sawing process, a cutting area could become wide to partially remove an alignment key or a test pattern that correspond to the third subsidiary pattern 21s. In this case, a bonding yield could decrease due to bonding voids or short defects in which metal burrs generated from cutting of subsidiary patterns are in contact with adjacent leads in a subsequent bonding process.

For a wafer structure before a semiconductor chip is diced, the breaking region BR may also be provided thereon with the lower intermetallic dielectric layers 10 formed of a porous dielectric material or a low-k dielectric material. Such material characteristics could cause difficulty in using the laser to cut the lower intermetallic dielectric layers 10, and therefore the semiconductor chip may not be divided to lead chipping or peeling failure.

In contrast, according to an embodiment, the breaking region BR may not include the lower intermetallic dielectric layers 10, and may include the buried dielectric pattern 27b and the first capping layer 25, each of which is formed of a material capable of being easily cut with a laser beam, with the result that the semiconductor chip may be free of incomplete or no dicing. Accordingly, chipping or peeling failure may be prevented or minimized.

Moreover, according to an embodiment, the formation of the third trench TR3 may help remove a large amount of portions or material that would otherwise be removed by laser beams, and thus it is possible to help reduce the burden of the sawing process. Furthermore, portions removed with or by the laser beams may be minimized, to allow a test pattern or an alignment key to perfectly or satisfactorily remain without being removed. In an implementation, when the laser beam is used, a cutting surface may not be rough but be smooth, compared to a case in which a blade is used.

By way of summation and review, a scribe lane may include an alignment key thereon for the exposure process or may include a test pattern for monitoring electrical properties and defective patterns of the semiconductor devices on the chip regions to inspect whether a process is normally performed.

For a semiconductor chip according to some embodiments, an outermost surface (or cutting surface) may be blocked by a first capping layer and a buried dielectric pattern, and thus it may be possible to help prevent moisture absorption or lateral crack (from the cutting surface). In addition, a separation dielectric pattern may be spaced apart from a primary lower dielectric stack and an edge lower dielectric stack, and thus it may be possible to much effectively prevent lateral crack and moisture absorption. Accordingly, semiconductor chips and semiconductor packages may be achieved to have increased reliability.

In a method of fabricating a semiconductor chip according to an embodiment, both lateral cracks and non-dicing issues may be prevented to help increase a yield.

One or more embodiments may provide a semiconductor chip with increased reliability.

One or more embodiments may provide a semiconductor package with increased reliability.

One or more embodiments may provide a semiconductor chip fabrication method capable of increasing a yield.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor chip, comprising:
a substrate that includes a device region and an edge region;
a device layer and a wiring layer that are sequentially stacked on the substrate;
a subsidiary pattern on the wiring layer on the edge region;
a first capping layer that covers a sidewall of the subsidiary pattern, a top surface of the wiring layer, and a sidewall of the wiring layer, the first capping layer including an upper outer sidewall and a lower outer sidewall, the lower outer sidewall being offset from the upper outer sidewall; and
a buried dielectric pattern in contact with the lower outer sidewall of the first capping layer and spaced apart from the upper outer sidewall of the first capping layer, such that the first capping layer is between the buried dielectric pattern and wiring layer.

2. The semiconductor chip as claimed in claim 1, wherein a top surface of the buried dielectric pattern is at a same level as a level of a bottom end of the upper outer sidewall.

3. The semiconductor chip as claimed in claim 1, wherein:
the wiring layer includes a lower dielectric stack and an upper dielectric stack that are sequentially stacked,
the lower dielectric stack includes lower dielectric layers,
the upper dielectric stack includes upper dielectric layers,
each of the lower dielectric layers includes a dielectric material that has a dielectric constant less than a dielectric constant of silicon oxide, and
each of the upper dielectric layers includes a dielectric material that has a dielectric constant greater than the dielectric constant of the dielectric material included in each of the lower dielectric layers.

4. The semiconductor chip as claimed in claim 3, wherein:
the lower dielectric stack includes:
a primary lower dielectric stack that covers the device region and a portion of the edge region adjacent to the device region; and
an edge lower dielectric stack on the edge region and spaced apart from the primary lower dielectric stack, and
the upper dielectric stack includes:
a primary upper dielectric stack on the primary lower dielectric stack; and
an edge upper dielectric stack on the edge lower dielectric stack and spaced apart from the primary upper dielectric stack.

5. The semiconductor chip as claimed in claim 4, further comprising a guard ring structure in the primary lower dielectric stack on the edge region,
wherein, when viewed in a plan view, the guard ring structure surrounds the device region.

6. The semiconductor chip as claimed in claim 4, wherein the edge lower dielectric stack and the edge upper dielectric stack surround the primary lower dielectric stack and the primary upper dielectric stack, respectively.

7. The semiconductor chip as claimed in claim 4, further comprising a separation dielectric pattern between the primary lower dielectric stack and the edge lower dielectric stack and between the primary upper dielectric stack and the edge upper dielectric stack,
wherein the separation dielectric pattern includes a dielectric material that has a dielectric constant greater than the dielectric constant of the dielectric material included in each of the lower dielectric layers.

8. The semiconductor chip as claimed in claim 7, wherein the separation dielectric pattern extends onto the top surface of the wiring layer and the sidewall of the subsidiary pattern.

9. The semiconductor chip as claimed in claim 7, further comprising a second capping layer between the separation dielectric pattern and the primary lower dielectric stack, between the separation dielectric pattern and the edge lower dielectric stack, between the separation dielectric pattern and the primary upper dielectric stack, and between the separation dielectric pattern and the edge upper dielectric stack, wherein the second capping layer includes a material and has a thickness the same as a material and a thickness of the first capping layer.

10. The semiconductor chip as claimed in claim 1, wherein the first capping layer includes a material that has a density greater than a density of a material included in the buried dielectric pattern.

11. The semiconductor chip as claimed in claim 1, further comprising:
a pad pattern on the wiring layer on the device region;
a passivation layer that covers the pad pattern and the subsidiary pattern; and
a bonding pad that penetrates the passivation layer and contacts the pad pattern,
wherein a top surface of the bonding pad is coplanar with a top surface of the passivation layer.

12. A semiconductor chip, comprising:
a substrate that includes a device region and an edge region;
a device layer and a wiring layer that are sequentially stacked on the substrate;
a separation dielectric pattern that penetrates the wiring layer while being adjacent to a boundary between the device region and the edge region;
a subsidiary pattern on the wiring layer on the edge region;
a pad pattern on the wiring layer on the device region;
a passivation layer that covers the pad pattern and the subsidiary pattern;
a first capping layer that covers a sidewall of the subsidiary pattern and a sidewall of the wiring layer; and
a buried dielectric pattern in contact with a lower outer sidewall of the first capping layer,
wherein:
a top surface of the buried dielectric pattern forms a stepped region extending from a top surface of the passivation layer,
the wiring layer includes a lower dielectric stack and an upper dielectric stack that are sequentially stacked,
a dielectric material included in the lower dielectric stack has a dielectric constant less than a dielectric constant of a dielectric material included in the upper dielectric stack,
the subsidiary pattern includes a test pattern or an alignment key, and
a density of the first capping layer is greater than a density of the buried dielectric pattern.

13. The semiconductor chip as claimed in claim 12, further comprising a second capping layer between the separation dielectric pattern and the wiring layer and between the separation dielectric pattern and the device layer,
wherein the second capping layer includes a material and has a thickness the same as a material and a thickness of the first capping layer.

14. The semiconductor chip as claimed in claim 12, wherein:
the first capping layer has an upper outer sidewall that is offset from the lower outer sidewall and is spaced apart from the buried dielectric pattern, and
a bottom end of the upper outer sidewall is at a same level as a level of the top surface of the buried dielectric pattern.

15. The semiconductor chip as claimed in claim 12, wherein:
the separation dielectric pattern penetrates the wiring layer and divides the wiring layer into a primary wiring structure on the device region and an edge wiring structure on the edge region, and
the edge wiring structure surrounds the primary wiring structure.

16. A semiconductor package, comprising:
a first semiconductor chip;
second semiconductor chips stacked on the first semiconductor chip; and
a mold layer that covers lateral surfaces of the second semiconductor chips and a top surface of the first semiconductor chip,
wherein:
each of the second semiconductor chips includes a second substrate and a circuit structure below the second substrate,
the second substrate includes a device region and an edge region that surrounds the device region,
the circuit structure includes:
a device layer and a wiring layer that sequentially stacked below the second substrate;
a subsidiary pattern below the wiring layer on the edge region;
a pad pattern below the wiring layer on the device region;
a passivation layer that covers a bottom surface of the pad pattern and a bottom surface of the subsidiary pattern;
a first capping layer that covers a sidewall of the subsidiary pattern and a sidewall of the wiring layer; and
a buried dielectric pattern in contact with an upper outer sidewall of the first capping layer,
a bottom surface of the buried dielectric pattern forms a stepped region extending from a bottom surface of the passivation layer, and
the mold layer fills the stepped region.

17. The semiconductor package as claimed in claim 16, wherein each of the second semiconductor chips further includes a separation dielectric pattern that penetrates the wiring layer and is adjacent to a boundary between the device region and the edge region.

18. The semiconductor package as claimed in claim 16, wherein:
the wiring layer includes a lower dielectric stack and an upper dielectric stack that are sequentially stacked,
a dielectric material included in the upper dielectric stack has a dielectric constant less than a dielectric constant of a dielectric material included in the lower dielectric stack,
the subsidiary pattern includes a test pattern or an alignment key, and
a density of the first capping layer is greater than a density of the buried dielectric pattern.

19. The semiconductor package as claimed in claim 16, wherein:
the first capping layer has a lower outer sidewall that is offset from the upper outer sidewall and is spaced apart from the buried dielectric pattern, and
a top end of the lower outer sidewall is at a same level as a level of the bottom surface of the buried dielectric pattern.

20. The semiconductor package as claimed in claim 16, wherein:
- the separation dielectric pattern penetrates the wiring layer to divide the wiring layer into a primary wiring structure on the device region and an edge wiring structure on the edge region, and
- the edge wiring structure surrounds the primary wiring structure.

\* \* \* \* \*